United States Patent
Fenwick et al.

(10) Patent No.: US 10,174,439 B2
(45) Date of Patent: Jan. 8, 2019

(54) NUCLEATION OF ALUMINUM NITRIDE ON A SILICON SUBSTRATE USING AN AMMONIA PREFLOW

(71) Applicant: Toshiba Electronic Devices & Storage Corporation, Tokyo (JP)

(72) Inventors: William E. Fenwick, Livermore, CA (US); Jeff Ramer, Fremont, CA (US)

(73) Assignee: Samsung Electronics Co., Ltd., Gyeonggi-do (KR)

(*) Notice: Subject to any disclaimer, the term of this patent is extended or adjusted under 35 U.S.C. 154(b) by 89 days.

(21) Appl. No.: 15/466,452

(22) Filed: Mar. 22, 2017

(65) Prior Publication Data

US 2017/0198410 A1 Jul. 13, 2017

Related U.S. Application Data

(62) Division of application No. 14/325,195, filed on Jul. 7, 2014, now Pat. No. 9,617,656, which is a division
(Continued)

(51) Int. Cl.
*C23C 16/34* (2006.01)
*C30B 25/18* (2006.01)
(Continued)

(52) U.S. Cl.
CPC .......... *C30B 25/183* (2013.01); *C30B 25/10* (2013.01); *C30B 25/14* (2013.01); *C30B 25/186* (2013.01);
(Continued)

(58) Field of Classification Search
CPC ....... C23C 16/30; C23C 16/34; C23C 16/301; C23C 16/302; C23C 16/0227
See application file for complete search history.

(56) References Cited

U.S. PATENT DOCUMENTS 4,511,816 A * 4/1985 Mikoshiba ......... H03H 9/02834
310/313 A
5,306,662 A 4/1994 Nakamura et al.
(Continued)

FOREIGN PATENT DOCUMENTS

CN 1713349 A 12/2005
CN 1825539 A 8/2006
(Continued)

OTHER PUBLICATIONS

Mayer, T.M., et al., "Mechanism of Nucleation and Atomic Layer Growth of AlN on Si". Chem. Mater., vol. 3, No. 4, 1991, pp. 641-646.*
(Continued)

*Primary Examiner* — Bret P Chen
(74) *Attorney, Agent, or Firm* — Harness, Dickey & Pierce, P.L.C.

(57) ABSTRACT

A silicon wafer used in manufacturing crystalline GaN for light emitting diodes (LEDs) includes a silicon substrate, a buffer layer of aluminum nitride (AlN) and an upper layer of GaN. The silicon wafer has a diameter of at least 200 millimeters and an Si(111)1×1 surface. The AlN buffer layer overlies the Si(111) surface. The GaN upper layer is disposed above the buffer layer. Across the entire wafer substantially no aluminum atoms of the AlN are present in a bottom most plane of atoms of the AlN, and across the entire wafer substantially only nitrogen atoms of the AlN are present in the bottom most plane of atoms of the AlN. A method of making the AlN buffer layer includes preflowing a first amount of ammonia equaling less than 0.01% by volume of hydrogen flowing through a chamber before flowing trimethylaluminum and then a subsequent amount of ammonia through the chamber.

21 Claims, 5 Drawing Sheets

Related U.S. Application Data of application No. 13/190,420, filed on Jul. 25, 2011, now abandoned.

(51) Int. Cl.
*H01L 21/02* (2006.01)
*H01L 29/20* (2006.01)
*H01L 33/00* (2010.01)
*C30B 25/14* (2006.01)
*C30B 25/10* (2006.01)
*C30B 29/40* (2006.01)

(52) U.S. Cl.
CPC ........ *C30B 29/406* (2013.01); *H01L 21/0254* (2013.01); *H01L 21/0262* (2013.01); *H01L 21/02381* (2013.01); *H01L 21/02458* (2013.01); *H01L 21/02502* (2013.01); *H01L 29/2003* (2013.01); *H01L 33/0066* (2013.01); *H01L 33/0075* (2013.01)

(56) References Cited

U.S. PATENT DOCUMENTS

| | | |
|---|---|---|
| 5,408,120 A | 4/1995 | Manabe et al. |
| 5,432,808 A | 7/1995 | Hatano et al. |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,766,783 A | 6/1998 | Utsumi et al. |
| 5,777,350 A | 7/1998 | Nakamura et al. |
| 5,959,307 A | 9/1999 | Nakamura et al. |
| 5,959,401 A | 9/1999 | Asami et al. |
| 5,974,069 A | 10/1999 | Tanaka et al. |
| 6,005,258 A | 12/1999 | Manabe et al. |
| 6,040,588 A | 3/2000 | Koide et al. |
| RE36,747 E | 6/2000 | Manabe et al. |
| 6,121,635 A | 9/2000 | Watanabe et al. |
| 6,215,133 B1 | 4/2001 | Nakamura et al. |
| 6,242,764 B1 | 6/2001 | Ohba et al. |
| 6,265,726 B1 | 7/2001 | Manabe et al. |
| 6,326,236 B1 | 12/2001 | Koide et al. |
| 6,391,748 B1 | 5/2002 | Temkin et al. |
| 6,420,733 B2 | 7/2002 | Koide et al. |
| 6,541,293 B2 | 4/2003 | Koide et al. |
| 6,610,995 B2 | 8/2003 | Nakamura et al. |
| 6,617,060 B2 | 9/2003 | Weeks, Jr. et al. |
| 6,657,236 B1 | 12/2003 | Thibeault et al. |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,193,246 B1 | 3/2007 | Tanizawa et al. |
| 7,247,985 B2 | 7/2007 | Kaneko et al. |
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,547,925 B2 | 6/2009 | Wong et al. |
| 7,589,360 B2 | 9/2009 | Matocha et al. |
| 7,611,917 B2 | 11/2009 | Emerson et al. |
| 7,687,827 B2 | 3/2010 | Piner et al. |
| 7,691,651 B2 | 4/2010 | Park |
| 7,709,851 B2 | 5/2010 | Bader et al. |
| 7,737,459 B2 | 6/2010 | Edmond et al. |
| 7,754,514 B2 | 7/2010 | Yajima et al. |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,813,400 B2 | 10/2010 | Denbaars et al. |
| 7,910,937 B2 | 3/2011 | Chen et al. |
| 7,910,945 B2 | 3/2011 | Donofrio et al. |
| 7,939,844 B2 | 5/2011 | Hahn et al. |
| 7,947,994 B2 | 5/2011 | Tanizawa et al. |
| 7,968,865 B2 | 6/2011 | LaRoche et al. |
| 8,021,904 B2 | 9/2011 | Chitnis |
| 8,030,665 B2 | 10/2011 | Nagahama et al. |
| 2003/0178642 A1 | 9/2003 | Tanaka et al. |
| 2006/0191474 A1 | 8/2006 | Chen et al. |
| 2007/0210304 A1 | 9/2007 | Komiyama et al. |
| 2008/0105880 A1 | 5/2008 | Edwards et al. |
| 2008/0111144 A1 | 5/2008 | Fichtenbaum et al. |
| 2008/0182411 A1* | 7/2008 | Elers ................. C23C 16/34 438/685 |
| 2008/0296625 A1* | 12/2008 | Li ................. H01L 21/02381 257/200 |
| 2008/0296626 A1 | 12/2008 | Haskell et al. |
| 2009/0068822 A1* | 3/2009 | Kim ................. C30B 25/02 438/503 |
| 2009/0218599 A1 | 9/2009 | Mishra et al. |
| 2009/0269867 A1* | 10/2009 | Shakuda ................. C30B 25/14 438/29 |
| 2009/0315150 A1* | 12/2009 | Hirota ................. C30B 19/00 257/615 |
| 2010/0012948 A1 | 1/2010 | Usikov et al. |
| 2010/0012977 A1* | 1/2010 | Derluyn ................. H01L 29/2003 257/194 |
| 2010/0032683 A1* | 2/2010 | Ikeda ................. H01L 29/10 257/76 |
| 2011/0003420 A1 | 1/2011 | Chen et al. |
| 2011/0062016 A1* | 3/2011 | Araki ................. C23C 14/0036 204/192.25 |
| 2011/0101391 A1 | 5/2011 | Miki et al. |
| 2011/0147772 A1 | 6/2011 | Lochtefeld et al. |
| 2012/0156819 A1 | 6/2012 | Zhu et al. |
| 2013/0026482 A1 | 1/2013 | Fenwick |
| 2017/0213718 A1* | 7/2017 | Sundaram ................. C30B 25/02 |

FOREIGN PATENT DOCUMENTS

| | | |
|---|---|---|
| JP | 8264894 | 10/1996 |
| JP | 2626431 B2 | 7/1997 |
| JP | 2666237 B2 | 10/1997 |
| JP | 2681733 B2 | 11/1997 |
| JP | 2735057 B2 | 4/1998 |
| JP | 2778405 B2 | 7/1998 |
| JP | 2785254 B2 | 8/1998 |
| JP | 2803741 B2 | 9/1998 |
| JP | 2827794 B2 | 11/1998 |
| JP | 11040847 | 2/1999 |
| JP | 2890396 B2 | 5/1999 |
| JP | 2917742 B2 | 7/1999 |
| JP | 2956489 B2 | 10/1999 |
| JP | 3063756 B1 | 7/2000 |
| JP | 2000-277441 A | 10/2000 |
| JP | 3063757 B1 | 10/2000 |
| JP | 3135041 B2 | 2/2001 |
| JP | 3209096 B2 | 9/2001 |
| JP | 3223832 B2 | 10/2001 |
| JP | 3250438 B2 | 1/2002 |
| JP | 3304787 B2 | 7/2002 |
| JP | 3314666 B2 | 8/2002 |
| JP | 3344257 B2 | 11/2002 |
| JP | 3374737 B2 | 2/2003 |
| JP | 3424629 B2 | 7/2003 |
| JP | 3427265 B2 | 7/2003 |

(56) References Cited

FOREIGN PATENT DOCUMENTS

| JP | 3506874 B2 | 3/2004 |
|---|---|---|
| JP | 3511970 B2 | 3/2004 |
| JP | 3548442 B2 | 7/2004 |
| JP | 3551101 B2 | 8/2004 |
| JP | 3622562 B2 | 2/2005 |
| JP | 3646649 B2 | 5/2005 |
| JP | 3654738 B2 | 6/2005 |
| JP | 3748011 B2 | 2/2006 |
| JP | 3780887 B2 | 5/2006 |
| JP | 3786114 B2 | 6/2006 |
| JP | 3795624 B2 | 7/2006 |
| JP | 3890930 B2 | 3/2007 |
| JP | 4118370 B2 | 7/2008 |
| JP | 4118371 B2 | 7/2008 |
| JP | 4267376 B2 | 5/2009 |
| JP | 2010-509177 A | 3/2010 |
| JP | 4629178 B2 | 2/2011 |
| JP | 4860024 B2 | 1/2012 |
| JP | 4904261 B2 | 3/2012 |

OTHER PUBLICATIONS

Pearce, L.G., et al., "Aluminum nitride on silicon surface acoustic wave devices". Appl. Phys. Lett. 39(11), Dec. 1, 1981, pp. 878-879.*
Liaw, H. Ming, et al., "The Characterization of Sputtered Polycrystalline Aluminum Nitride on Silicon by Surface Acoustic Wave Measurements". IEEE Transactions on Ultrasonics, Ferroelectrics, and Frequency Control, vol. 42, No. 3, May 1995, pp. 404-409.*
Morita, Mizuho, et al., "Aluminum Nitride Epitaxially Grown on Silicon: Orientation Relationships". Japanese Journal of Applied Physics, vol. 20, No. 3, Mar. 1981, pp. L173-175.*
Clement, M., et al., "SAW characteristics of AlN films sputtered on silicon substrates". Ultrasonics 42 (2004) 403-407.*
Office Action issued for Taiwan Patent Application No. 101120376 dated Jul. 28, 2014, 6 pages with English language translation.
Office Action issued for Korean Patent Application No. 10-2013-7023522 dated Dec. 26, 2014, 8 pages with English language translation.
Office Action issued for the Japanese Patent Application No. 2014-510553 dated Jan. 28, 2015, 4 pages with English language translation.
Office Action issued for Chinese Patent Application No. 201280012100.5 dated May 4, 2015; 27 pages with English translation.
Office Action issued for Japanese Patent Application No. 2015-148097 dated May 23, 2016; 6 pages with English language translation.
Office Action issued for Chinese Patent Application No. 201280012100.5 dated Jun. 28, 2016, 9 pages with English language translation.
Cooke, M. "High-Brightness Nitride LEDs on Silicon Through Wafer Bonding", Jun. 4, 2011. (URL: "http://www.semiconductor-today.com/news_items/2011/JUNE/KOREAPHOTONICS_040611.html"), 2 pages.
Bae et al. "Surface Investigation of a Cubic AlN Buffer Layer and GaN Grown on Si (111) and Si (100) as Revealed by Atomic Force Microscopy" Journal of the Korean Physical Society, vol. 49, No. 3, Sep. 2006, pp. 1092-1096, 5 pages.
Dadgar et al. "Epitaxy of GaN on Silicon-Impact of Symmetry and Surface Reconstruction," New Journal of Physics, vol. 9, No. 389, 2007, 10 pages.
Zang et al. "Structural Analysis of Metalorganic Chemical Vapor Deposited AlN Nucleation Layers on Si (111), " J. Crystal Growth, vol. 268, 2004, 4 pages.
Reentila, O. et al. "Effect of the AlN Nucleation Layer Growth on AlN Material Quality," Journal of Crystal Growth, 310 (2008) 4932-4934. 3 pages.
Zang, K. et al. "Evolution of AlN Buffer Layers on Silicon and the Effect on the Property of the Expitaxial GaN Film," 2003, pp. 1-6, 6 pages.
Huantao, D. et al. "Effect of a High Temperature AlN Buffer Layer Grown by Initially Alternating Supply of Ammonia on AlGaN/GaN Heterostructures," Journal of Semiconductors vol. 30, No. 9, Sep. 2009, pp. 1-4, 4 pages.
Zhiqin L. et al. "AlN: Si Buffer Layer on Si(111) Substrate Effect on GaN Film," in Photonics and Optoelectronics (SOPO), 2012 Symposium, May 21-23, 2012, pp. 1-3, 3 pages.
International Search Report and Written Opinion by the Korean Intellectual Property Office dated Jan. 23, 2013 for PCT/US2012/041779, 9 pages.
Osinsky et al. 'Visible-Blind GaN Schottky Barrier Detectors Grown on Si(111), Applied Physics Letters, vol. 72, No. 5, 1998, pp. 551-553.

* cited by examiner

NUCLEATION OF ALUMINUM NITRIDE ON A SILICON SUBSTRATE USING AN AMMONIA PREFLOW

CROSS-REFERENCE TO RELATED APPLICATIONS

The present application is a divisional of, commonly assigned, patent application Ser. No. 14/325,195 entitled "NUCLEATION OF ALUMINUM NITRIDE ON A SILICON SUBSTRATE USING AN AMMONIA PREFLOW." filed Jul. 7, 2014, now U.S. Pat. No. 9,617,656, which itself is a divisional of patent application Ser. No. 13/190,420 entitled "NUCLEATION OF ALUMINUM NITRIDE ON A SILICON SUBSTRATE USING AN AMMONIA PREFLOW," filed Jul. 25, 2011, the disclosures of which are hereby incorporated herein by reference.

TECHNICAL FIELD

The present invention relates generally to methods of growing gallium nitride on silicon.

BACKGROUND INFORMATION

Thin films of Group III nitride, such as gallium nitride (GaN), are used in the production of efficient optoelectronic light emitters. Conventionally, GaN has been grown directly on sapphire substrates ($Al_2O_3$). The GaN is grown in thin layers as opposed to in a single three-dimensional growth mode in order to achieve a high quality crystalline structure of the epitaxial growth. Growing the epitaxial layers of GaN on silicon as opposed to on sapphire offers considerable cost savings because of the economies of scale from the large production of silicon for the semiconductor industry. A large amount of equipment for the production of crystalline silicon has already been depreciated. That equipment can now be used in the production of light emitting diodes (LEDs).

Current attempts to grow high quality epitaxial layers of GaN on silicon substrates, however, have not been entirely successful. Because of the great difference between the lattice constants and thermal expansion coefficients of GaN and silicon, GaN is not well suited for epitaxial growth directly on a silicon substrate. GaN epilayers often crack upon cooling to room temperature because even at growth temperatures above 1000° C. the lattice constant of GaN is much smaller than that of crystalline silicon. In addition, GaN has a much larger coefficient of thermal expansion than does silicon. So as the layers of GaN grown on silicon at high temperature cool to room temperature, the smaller lattice distance of the GaN crystals relative to the silicon crystals becomes even more pronounced. The GaN layers deposited directly on silicon are subjected to even more tensile stress as they cool and can even cause the underlying silicon substrate to bow.

Consequently, attempts have been made to grow buffer layers between the silicon substrate and the epitaxial GaN layers in order to compensate for the differing lattice constants and thermal expansion coefficients of GaN and silicon. For example, buffer layers of AlN, AlGaN and AlGaIN have been grown between the silicon substrate and the GaN layers.

The quality of the epitaxial GaN layers, however, that can be grown over existing buffer layers has been poor. Current methods of forming buffer layers of AlN and AlGaN have resulted in epitaxial growth of GaN layers that contain structural defects such as discontinuities, dislocations and faults. These defects degrade the morphology and optical properties of the GaN layers, rendering the GaN layers unsuitable for use in high quality LEDs.

A method is sought for growing buffer layers on a silicon substrate that allows high quality epitaxial GaN layers with fewer structural defects to be grown over the buffer layers.

SUMMARY

A silicon wafer used in manufacturing crystalline gallium nitride (GaN) for light emitting diodes (LEDs) includes a silicon substrate, a buffer layer of aluminum nitride (AlN), a second buffer layer of aluminum gallium nitride ($Al_xGa_{1-x}N$), and an upper layer of GaN. The silicon wafer has a diameter of at least 200 millimeters and an Si(111) 1×1 surface (as opposed to a Si(111) 7×7 reconstructed surface). The AlN buffer layer overlies the Si(111) surface of the substrate and is between 205 to 250 nanometers thick. The second buffer layer of aluminum gallium nitride is disposed between the buffer layer of aluminum nitride and the upper layer of gallium nitride.

Across the entire wafer substantially no aluminum atoms of the AlN are present in a bottom most plane of atoms of the AlN buffer layer, and across the entire wafer substantially only nitrogen atoms of the AlN buffer layer are present in the bottom most plane of atoms of the AlN. Thus, the AlN buffer layer has a single polarity. The silicon and AlN are oriented as AlN<0001>||Si<111>. No amount of metallic aluminum is disposed between the silicon substrate and the AlN buffer layer. In addition, no layer of $SiN_x$ is present between the silicon substrate and the AlN buffer layer.

A method of making an AlN buffer layer includes preflowing a first small amount of ammonia ($NH_3$) before flowing trimethylaluminum in order to form single polarity AlN. The crystallinity of the AlN buffer layer is influenced by the quality of the initial nucleation layer of AlN and the nature of the atomic bonding between the AlN and the silicon(111) surface. Because of the ammonia preflow step, the initial nucleation layer of AlN begins to grow with only nitrogen atoms bonded to the silicon(111) surface over the entire surface of the silicon wafer.

In a first cleaning step, a substrate of silicon (Si) is heated to a temperature above 950° C. in a reaction chamber of a metal-organic chemical vapor deposition (MOCVD) device. Then hydrogen ($H_2$) is flowed through the chamber in an amount between 106 and 118 cubic centimeters of hydrogen per minute over each square centimeter of the surface of the silicon substrate. In one aspect, the temperature in the chamber during the flowing of hydrogen is above 1100° C.

In the ammonia preflow step, a first amount of ammonia is flowed through the reaction chamber while the hydrogen is still flowing through the chamber. The first amount of ammonia is less than 001% by volume of the hydrogen flowing through the chamber. The first amount of ammonia does not exceed 0.006 cubic centimeters per minute over each square centimeter of the surface of the silicon substrate. The ammonia preflow step is performed for between thirty seconds to three minutes. The temperature in the chamber during the ammonia preflow step is between 1000° C. and 1050° C.

Then, trimethylaluminum ($Al_2(CH_3)_6$) is flowed through the chamber while the hydrogen and first amount of ammonia are still flowing through the chamber. The trimethylaluminum is flowed through the chamber for between ten to twenty minutes in an amount of about ninety micromoles per minute.

Then a subsequent amount of ammonia is flowed through the chamber while the trimethylaluminum is still flowing through the chamber. The subsequent amount of ammonia is greater than 0.002% by volume of the hydrogen flowing through the chamber. In one aspect, the subsequent amount of ammonia flowed through the chamber was just under 5% of the total amount of hydrogen, ammonia and trimethylaluminum.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
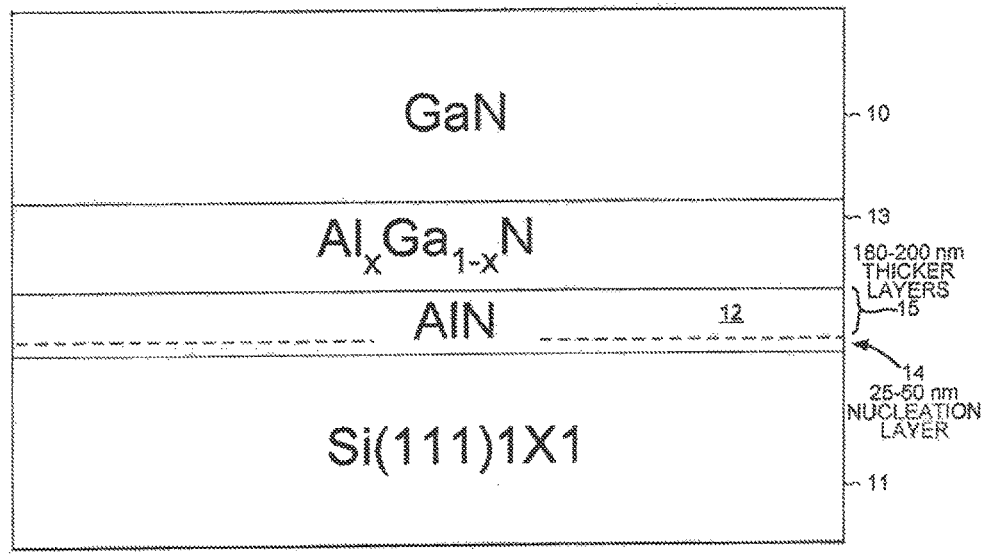
FIG. 1 is a cross-sectional view showing the growth of a single crystal GaN film on buffer layers over a silicon substrate.

FIG. 1 is a schematic diagram showing the growth of a single crystal GaN film 10 on buffer layers over a silicon substrate 11. A buffer layer of aluminum nitride (AlN) 12 is first grown on the silicon substrate 11. Then higher buffer of layers of aluminum gallium nitride ($Al_xGa_{1-x}N$) 13 are grown over the AlN layer 12. Finally, the GaN layer 10 is grown over the top layer of aluminum gallium nitride 13. In some embodiments, the GaN layer includes several sublayers. The buffer layer of AlN 12 is made up of a lower initial nucleation layer 14 and thicker upper layers 15.

There are several reasons for first growing buffer layers on a silicon substrate before the gallium nitride (GaN) layer 10 is grown. First, meltback etching of the silicon substrate 11 by gallium occurs if the gallium is allowed to react directly with the silicon substrate. The reaction between gallium and silicon results in poor crystal quality and morphology of the GaN layer 10. Second, $SiN_x$ can be formed as GaN is deposited on silicon, which leads to a 3-dimensional growth of GaN crystals instead of a 2-dimensional growth over the entire surface of the silicon substrate before the GaN layer thickens. Three-dimensional crystal growth leads to lower quality GaN layer than does 2-dimensional crystal growth. Third, the lattice mismatch between GaN and crystalline silicon causes a large tensile strain on the GaN layer at the interface with the silicon. The lattice mismatch at room temperature between GaN and the hexagonal surface orientation of silicon Si(111) is about 16.9%. Fourth, the in-plane thermal expansion coefficients of GaN on Si (111) vary widely ($5.59\times10^{-6}K^{-1}$ for GaN and $2.6\times10^{-6}K^{-1}$ for Si). The difference in thermal expansion coefficients can result in cracking of the GaN layer upon cooling from the growth temperature to room temperature.

To solve the problems caused by growing GaN directly on silicon, buffer layers are typically deposited between the silicon and the GaN. For example, a nucleation layer of AlN 12 can first be grown on the silicon substrate 11, followed by the additional buffer layers 13 of aluminum gallium nitride ($Al_xGa_{1-x}N$). The AlN nucleation layer and the other buffer layers solve the four problems described above. First, the AlN buffer layer 12 does not allow gallium to come into contact with the silicon substrate 11. Second, GaN is not grown directly on the silicon substrate, so the formation of amorphous $SiN_x$ can be prevented on the surface of the silicon, which would otherwise degrade the crystal formation of the GaN. Third, the lattice mismatch between GaN and Si(111) is compensated by the smaller lattice constant of AlN that applies compressive stress to the GaN to counteract the tensile stress of GaN from the underlying Si(111). Fourth, the smaller lattice constant of AlN compensates for the greater proportionate shrinking of the GaN crystal compared to the silicon crystal as both cool from the growth temperature to room temperature.

The quality of the GaN layer and other epitaxial layers, however, is also dependent on the quality of the AlN nucleation layer 12. Consequently, simply growing a layer of AlN to solve the aforementioned four problems that result from growing GaN directly on silicon will not necessarily result in high-quality GaN. The properties of the aluminum nitride nucleation layer 12, such as its dislocation density and surface morphology, are critical in influencing the properties of the higher epitaxial layers. The AlN layer 12 acts as a crystallographic template for the higher buffer layers and ultimately for the GaN layer 10. The properties of the AlN layer 12, in turn, are determined in large, part by the conditions under which the growth of the AlN is initiated and by how the silicon substrate 11 is treated prior to growth of the AlN.

It would seem that growing an AlN layer that has a low dislocation density over Si(111) would be hindered by the 23.4% lattice mismatch between AlN and Si(111). The distance between silicon atoms in the (111) plane of a silicon crystal is 3.840 angstroms, whereas the distance between aluminum atoms or between nitrogen atoms in the C-plane of wurtzite AlN is 3.112 angstroms. Smooth interface morphology between AlN and Si(111) can be achieved, however, due to the lattice coincidence between the (111) plane of silicon and the C-plane of AlN which permits the relaxation of the crystal stress at regular intervals of misfit dislocation at the AlN/Si interface. Achieving the same type of misfit dislocations at regular intervals is critical to obtaining a smooth interface morphology.

A method is disclosed for beginning the growth of AlN that results in a smooth interface between AlN and Si(111). The method grows a single polarity buffer layer of AlN having a low dislocation density. The subsequent buffer layers grown over the AlN buffer layer retain the high quality crystalline form and enable higher quality GaN and other epitaxial layers to be grown over the buffer layers.

Figure 2:
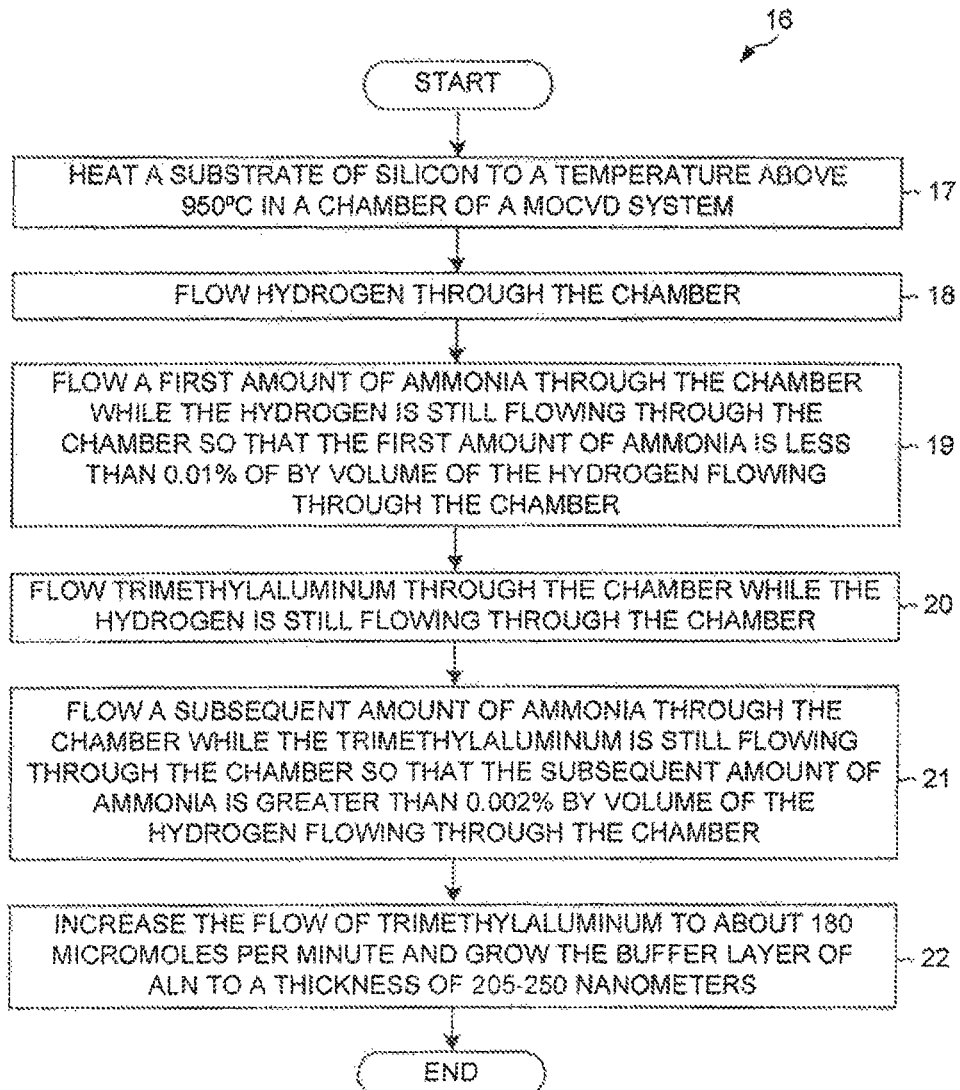
FIG. 2 is a flowchart of a method for growing an initial nucleation layer of AlN on a silicon substrate.

FIG. 2 is a flowchart illustrating steps of a method 16 for growing a high-quality AlN nucleation layer on a silicon substrate. In a first step 17, a substrate of silicon (Si) is heated to a temperature above 950° C. in a chamber. In one aspect, the substrate was heated to a temperature of 1140° C. in the reaction chamber of a metal-organic chemical vapor deposition (MOCVD) system (also called a metal-organic vapor phase epitaxy system). The substrate was in the form of three 8-inch silicon wafers cut along the (111) plane. The three wafers were placed on a wafer receptacle having a diameter of 465 millimeters.

Figure 3A:
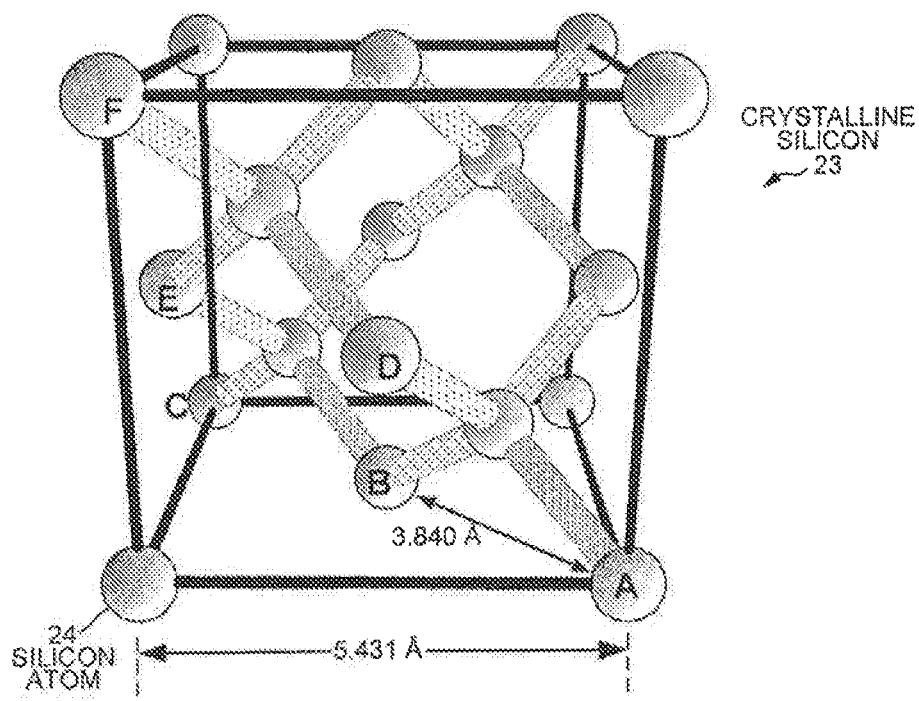
FIG. 3A shows a model of the crystal structure of silicon.
Figure 3B:
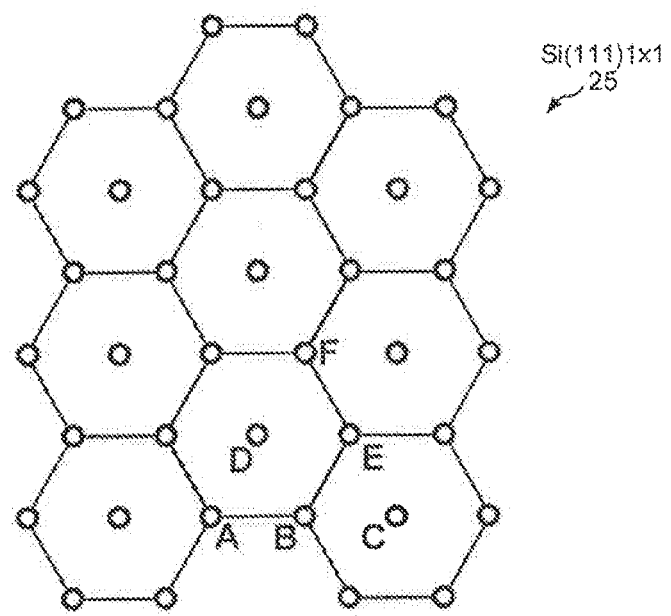
FIG. 3B is a diagram of the silicon atoms along an Si(111) 1×1 surface of silicon.

FIG. 3A is a diagram illustrating the crystal structure 23 of silicon. The (111) plane along which the three silicon wafers are cleaved is the plane that intersects the silicon atoms A, C and F in FIG. 3A. The silicon atoms A, F and 24 define the (010) plane, in which the silicon atoms form a square format. The distance between silicon atoms at adjacent corners of the squares of the identical (100), (010) and (001) planes is 5.431 angstroms. There is a shorter distance, however, between adjacent silicon atoms of the hexagonal format of the (111) plane. For example, the distance between atoms A and B in the (111) plane is 3.840 angstroms. This shorter distance between atoms in the hexagonal format of Si (111) better matches the distance between nitrogen atoms in the hexagonal format along the C-plane of AlN. FIG. 3B illustrates the atoms A-F of FIG. A in which the (111) plane coincides with the plane of the page. The surface of the three silicon wafers after first step 17 has a Si(111) 1×1 structure 25 as shown in FIG. 3B as opposed to the dimer-adatom-stacking (DAS) fault structure of the Si(111) 7×7 reconstruction. The more-stable, faceted Si(111) 7×7 surface structure breaks down to the regular Si(111) 1×1 hexagonal structure 25 as the silicon substrates are heated above about 850° C.

In step 18, hydrogen is flowed through the chamber in order to remove $SiO_2$ from the wafers and generally to clean the surface of the silicon substrate. Between 106 and 118 cubic centimeters of hydrogen per minute flow over each square centimeter of the surface of the substrate. In one aspect, 180-200 liters of hydrogen per minute was flowed through the chamber. The silicon substrate was baked in the hydrogen flow at 1140° C. for about fifteen minutes to remove the native oxide. Then, the temperature in the chamber was lowered to about 1020° C.

In step 19, a first amount of ammonia (NH3) is flowed through the chamber while the hydrogen is still flowing through the chamber. The first amount of ammonia is less than 0.01% of by volume of the hydrogen flowing through the chamber. The first amount of ammonia is flowed through the chamber for between thirty seconds to three minutes. In one aspect, less than ten cubic centimeters of ammonia per minute was flowed over the 465-mm wafer receptacle. Thus, less than 0.00588 cubic centimeters per minute of ammonia flowed over each square centimeter of the surface of the silicon substrate. At 1020° C., the first amount of ammonia is insufficient to form a layer of $SiN_x$ over the surface of the silicon substrate. The first amount of ammonia is, however, sufficient to form a small number of Si—N bonds on the Si(111) 1×1 surface.

In step 20, trimethylaluminum ($Al_2(CH_3)_6$) is flowed through the chamber while the hydrogen is still flowing through the chamber. The trimethylaluminum flows through the chamber in an amount of about ninety micromoles per minute. In one aspect, ninety micromoles per minute of trimethylaluminum flowed through the chamber for between ten to twenty minutes.

In step 21, a subsequent amount of ammonia is flowed through the chamber while the trimethylaluminum is still flowing through the chamber. The subsequent amount of ammonia is greater than 0.002% by volume of the hydrogen flowing through the chamber. In one aspect, the subsequent amount of ammonia flowed through the chamber was just under 5% of the total amount of hydrogen, ammonia and trimethylaluminum. When the subsequent amount of ammonia was flowed through the chamber at just under 5% of the total flow for about fifteen minutes, an initial nucleation layer 14 of aluminum nitride (AlN) grew to a thickness of between 25-50 nanometers. The crystallinity of the AlN buffer layer 12 is related to the quality of the initial nucleation layer 14 and the nature of the atomic bonding between the silicon(111) surface and the AlN. Because of the ammonia preflow in step 19, the initial nucleation layer 14 begins to grow with only nitrogen atoms bonded to the silicon(111) surface over the entire surface of the 8-inch wafers.

In a step 22, the flow of trimethylaluminum is increased to about 180 micromoles per minute, and the temperature in the chamber is increased to about 1120° C. The buffer layer of AlN is grown an additional 180-200 nanometers to a total thickness of 205-250 nanometers under the increased flow of trimethylaluminum.

Figure 4:
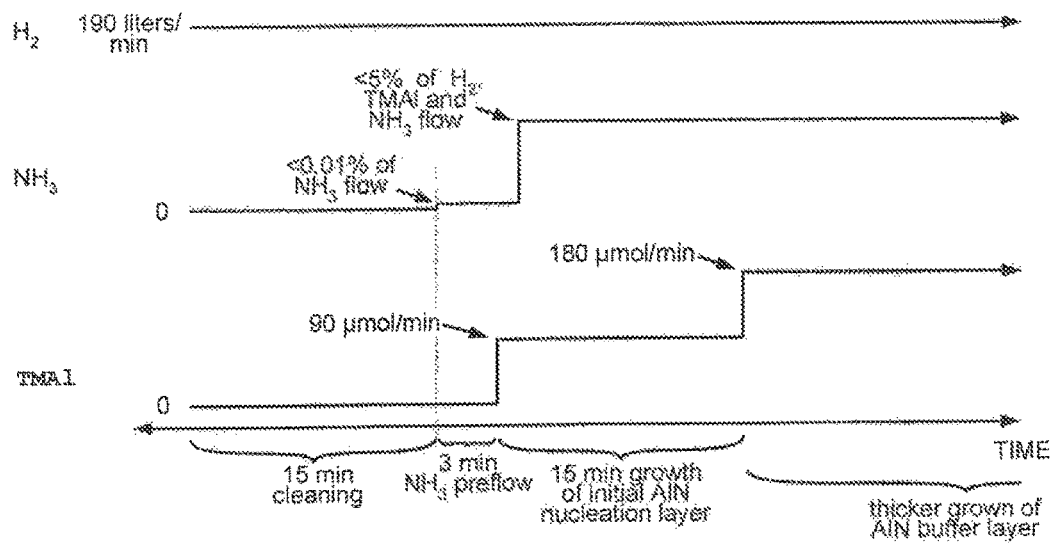
FIG. 4 is a graph of gas flows of hydrogen, ammonia and trimethylaluminum through a reaction chamber during the method of FIG. 2.

FIG. 4 is a graph that represents the flows of hydrogen, ammonia and trimethylaluminum through the reaction chamber during the cleaning, preflow, initial growth and thicker growth stages of the formation of the AlN buffer layer. In other embodiments, the additional 180-200 nanometers of AlN is grown in multiple stages of higher trimethylaluminum concentration as opposed to in one step.

The initial nucleation layer 14 of AlN first starts to form when the trimethylaluminum starts flowing through the chamber in step 20 and before the subsequent amount of ammonia is flowed through the chamber in step 21. Consequently, a very small amount of nitrogen is present on the Si(111) 1×1 surface of the silicon substrate 11 before the aluminum from the trimethylaluminum comes into contact with the substrate surface. As the first seed crystals of AlN are formed, the aluminum atoms form bonds to the nitrogen atoms that are present on the Si(111) 1×1 surface as opposed to directly with silicon atoms on the substrate surface. The nitrogen from the ammonia preflow step ensures that the polarity of the alternating layers of aluminum and nitrogen in the AlN crystals that are formed across the entire silicon wafer will have a nitrogen layer facing the silicon substrate and an aluminum layer on top.

Figure 5:
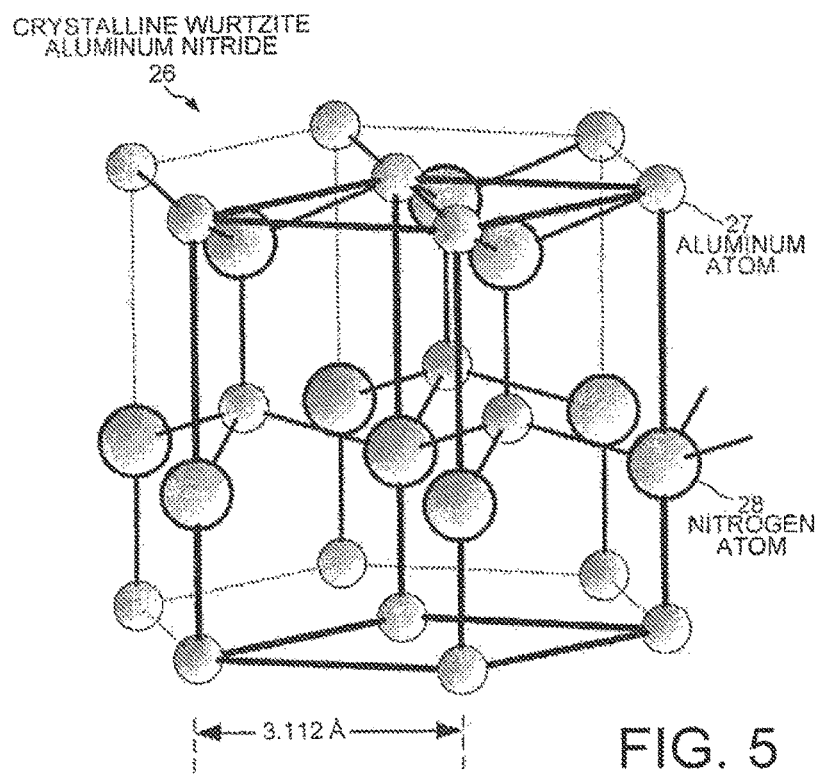
FIG. 5 shows a model of the crystal structure of wurtzite aluminum nitride.

FIG. 5 is a diagram illustrating the crystal structure 26 of wurtzite aluminum nitride (AlN). The smaller spheres represent aluminum atoms 27, and the larger spheres represent nitrogen atoms 28. The C-plane of the AlN crystal intersects all six aluminum atoms that form a hexagon on the top surface of the crystal. The distance between adjacent aluminum atoms around the hexagon in the C-plane is 3.112 angstroms. The distance between adjacent nitrogen atoms around the middle hexagon is therefore also 3.112 angstroms. The hexagons of nitrogen and aluminum along the C-plane of AlN approximately match the hexagonal format of silicon atoms on the Si(111) 1×1 surface of the silicon substrate.

Figure 6:
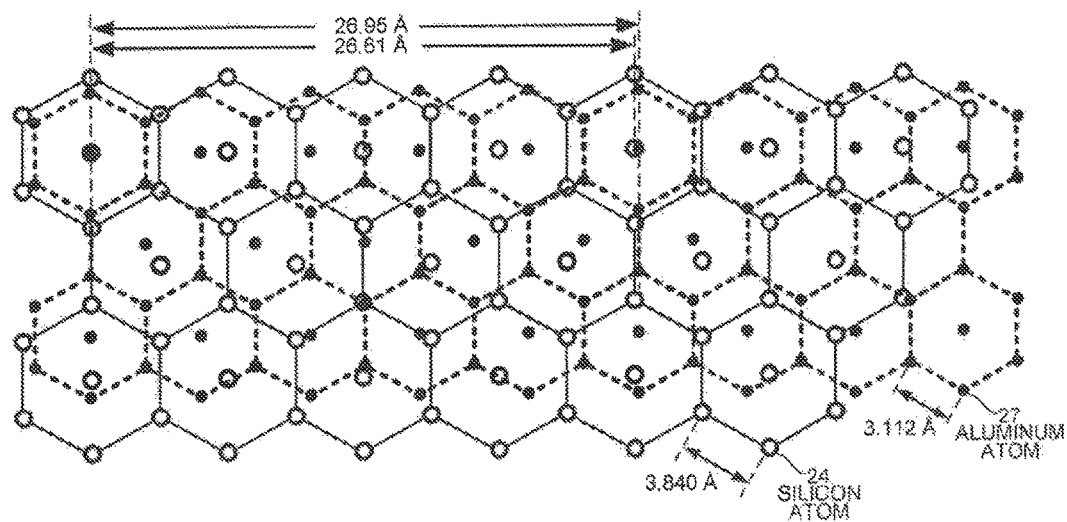
FIG. 6 is a diagram of the crystal structure of the aluminum hexagons in the C-plane of AlN superimposed over the crystal structure of silicon along the Si(111) 1×1 surface.

FIG. 6 is a diagram of the crystal structure of the aluminum hexagons in the C-plane of AlN superimposed over the crystal structure of the silicon substrate on the Si(111) 1×1 surface. Because the distance between atoms around the silicon hexagon is 3.840 angstroms and the distance between the atoms around the hexagons of AlN is 3.112 angstroms, the lattice distance of a silicon cell unit is 6.652 angstroms and the lattice distance of an AlN cell unit is 5.390 angstroms. Thus, there is a 23.4% lattice mismatch. However, the width of five AlN cell units (26.95 angstroms)

approximately matches the width of four silicon cell units (26.61 angstroms), as illustrated in FIG. 6. Every fifth AlN cell unit can bond well to every fourth silicon cell unit.

Figure 7:
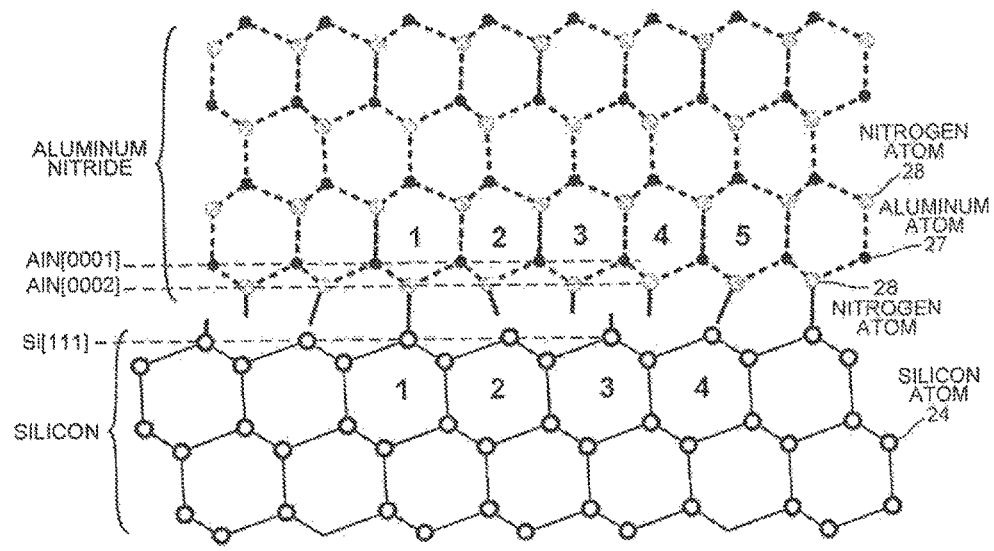
FIG. 7 is a diagram of the crystal structures of a silicon substrate and an AlN nucleation layer viewed perpendicular to the Si(111) surface.

FIG. 7 is a diagram of the crystal structures of the silicon substrate and AlN viewed perpendicular to the Si(111) 1×1 surface and the C-plane of AlN. FIG. 7 illustrates how each fifth cell unit of the MN crystal approximately matches each fourth cell unit on the Si(111) 1×1 surface. The regular mismatch between surface structures of AlN and silicon allows a crystal of AlN to be grown with a low dislocation density.

The dislocation density of the AlN buffer layer is considerably higher, however, if not all islands of AlN crystals that begin to form on the Si(111) 1×1 surface have the same polarity. If some islands of AlN crystals form with nitrogen atoms bonded to the silicon while other islands of AlN crystals form with aluminum atoms bonded to the silicon, then discontinuities and stacking faults will form where the islands of crystals having opposite polarity grow together. FIG. 7 shows that the initial nucleation layer of AlN formed using method 16 has only nitrogen atoms bonded to the Si(111) 1×1 surface. Across the entire substrate wafer substantially only nitrogen atoms of the aluminum nitride are present in the bottom most plane of atoms of the aluminum nitride. Because the initial nucleation layer of AlN formed using method 16 has a single polarity, it was possible to grow a GaN layer above the nucleation layer that had a dislocation density of less that $2 \times 10^9$ cm$^{-2}$.

Some prior methods of growing an AlN buffer layer begin by depositing a metallic Al layer on the surface of the silicon substrate before the AlN is grown in order to prevent the formation of amorphous SiN$_x$. The presence of aluminum atoms on surface of the silicon substrate probably causes at least some of the islands of AlN crystals to form with aluminum as the bottom most plane of atoms of the aluminum nitride. Because these prior art methods do not prevent at least some nitrogen atoms from bonding to the silicon substrate (not necessarily as amorphous SiN$_x$), some islands of AlN crystals form with nitrogen as the bottom most plane of atoms of the aluminum nitride, and the resulting AlN layer has mixed polarity. Method 16, on the other hand, allows a single polarity material to be grown.

Thus, method 16 can be Used to manufacture a wafer of silicon substrate over which an AlN buffer layer, AlGaN layers and finally an upper GaN layer are grown. The silicon substrate has an Si(111) surface, which converts from a 7×7 structure to a 1×1 structure when the silicon is heated above about 850° C. The AlN buffer layer is a means for compensating for the lattice mismatch between the GaN and the Si(111) surface of the silicon substrate so as to enable the upper GaN layer to grow under reduced stress. The AlGaN on top of the AlN buffer layer is a better lattice match for GaN than in silicon. The silicon substrate is a wafer with a diameter of at least 200 millimeters, such as an 8-inch wafer. The AlN buffer layer overlies the Si(111) surface of the substrate and is oriented as AlN<0001>||Si<111>. The upper layer of GaN is grown on the AlGaN layers over the AlN buffer layer. Across the entire wafer substantially no aluminum atoms of the aluminum nitride are present in a bottom most plane of atoms of the aluminum nitride, and across the entire wafer substantially only nitrogen atoms of the aluminum nitride are present in the bottom most plane of atoms of the aluminum nitride. Thus, across the entire wafer substantially only nitrogen atoms of the AlN buffer layer form bonds to the Si(111) surface. There is neither metallic aluminum nor any layer of SiN$_x$ present between the silicon substrate and the AlN buffer layer.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method, performed in sequential order of manufacturing a semiconductor device, the method comprising:
   first step, providing a silicon substrate in a chamber;
   second step, cleaning a surface of the silicon substrate with a flow of hydrogen in the chamber;
   third step, flowing a first amount of ammonia in the chamber while the hydrogen is still flowing into the chamber, wherein the first amount of ammonia forms nitrogen-silicon bonds at the surface of the silicon substrate;
   fourth step, flowing a first amount of trimethylaluminum (Al$_2$(CH$_3$)$_6$) into the chamber while the hydrogen is still flowing into the chamber; and
   fifth step, flowing a second amount of ammonia into the chamber, wherein the second amount of ammonia is greater than the first amount of ammonia by volume, and an initial AlN nuclear layer grows on the silicon substrate.

2. The method of claim 1 further comprising:
   sixth step, flowing a second amount of trimethylaluminum (Al$_2$(CH$_3$)$_6$) into the chamber while the hydrogen is still flowing into the chamber, wherein the second amount of trimethylaluminum (Al$_2$(CH$_3$)$_6$) is greater than the first amount of trimethylaluminum (Al$_2$(CH$_3$)$_6$) by volume.

3. The method of claim 2 wherein an amount of hydrogen flowing into the chamber is the same amount of hydrogen the first step, the second step, the third step, the fourth step, the fifth step, and the sixth step.

4. The method of claim 2 further comprising:
   seventh step, flowing a third amount of trimethylaluminum (Al$_2$(CH$_3$)$_6$) into the chamber while the hydrogen is still flowing into the chamber, wherein the third amount of trimethylaluminum (Al$_2$(CH$_3$)$_6$) is greater than the second amount of trimethylaluminum (Al$_2$(CH$_3$)$_6$) by volume.

5. The method of claim 4 further comprising:
   eighth step, flowing a fourth amount of trimethylaluminum (Al$_2$(CH$_3$)$_6$) into the chamber while the hydrogen is still flowing into the chamber, wherein the fourth amount of trimethylaluminum (Al$_2$(CH$_3$)$_6$) is greater than the third amount of trimethylaluminum (Al$_2$(CH$_3$)$_6$) by volume.

6. The method of claim 5 further comprising:
   ninth step, flowing a fifth amount of trimethylaluminum (Al$_2$(CH$_3$)$_6$) into the chamber while the hydrogen is still flowing into the chamber, wherein the fifth amount of trimethylaluminum (Al$_2$(CH$_3$)$_6$) is greater than the fourth amount of trimethylaluminum (Al$_2$(CH$_3$)$_6$) by volume.

7. The method of claim 2 wherein the second amount of trimethylaluminum (Al$_2$(CH$_3$)$_6$) flows at least 180 μmol/min.

8. The method of claim 2 wherein a temperature in the chamber during the sixth step is 1120° C.

9. The method of claim 1 wherein the fourth step further comprises:
flowing the first trimethylaluminum ($Al_2(CH_3)_6$) into the chamber while the first amount of ammonia is still flowing into the chamber.

10. The method of claim 1 wherein the fifth step further comprises:
flowing the second amount of ammonia into the chamber while the hydrogen is still flowing into the chamber.

11. The method of claim 10 wherein the fifth step further comprises:
flowing the second amount of ammonia into the chamber while the first amount of first trimethylaluminum ($Al_2(CH_3)_6$) is still flowing into the chamber.

12. The method of claim 1 wherein the first amount of ammonia is less than 0.01% by volume of the hydrogen flowing into the chamber.

13. The method of claim 1 wherein the second amount of ammonia is greater than 0.002% by volume of the hydrogen flowing into the chamber.

14. The method of claim 1 wherein the second amount of ammonia is less than 5% of a total amount of the hydrogen, the first amount of ammonia, and the first trimethylaluminum ($Al_2(CH_3)_6$) by volume.

15. The method of claim 1 wherein the first amount of trimethylaluminum ($Al_2(CH_3)_6$) flows between 90 μmol/min and 180 μmol/min.

16. The method of claim 1 further comprising:
heating the silicon substrate to a temperature above 950° C. prior to the second step.

17. The method of claim 1 further comprising:
heating the silicon substrate to a temperature of 1140° C. prior to the second step.

18. The method of claim 1 wherein a temperature in the chamber during the second step is above 1100° C.

19. The method of claim 1 wherein a temperature in the chamber during the second step is 1140° C.

20. The method of claim 1 wherein a temperature in the chamber during the third step is between 1000° C. and 1050° C.

21. The method of claim 1 wherein a temperature in the chamber during the third step is 1020° C.

* * * * *